United States Patent
Perraud et al.

(10) Patent No.: US 6,518,903 B1
(45) Date of Patent: Feb. 11, 2003

(54) ANALOG-TO-DIGITAL CONVERTER

(75) Inventors: Laurent C. Perraud, St Jeannet (FR); Jean-Olivier Plouchart, New York, NY (US); Mehmet Soyuer, Yorktown Heights, NY (US); Nicolas Sornin, Nice (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/649,733

(22) Filed: Aug. 28, 2000

Related U.S. Application Data

(60) Provisional application No. 60/174,682, filed on Jan. 6, 2000.

(51) Int. Cl.⁷ .................................................. H03M 3/00
(52) U.S. Cl. ........................................ 341/143; 341/155
(58) Field of Search ................................ 341/143, 155; 375/25, 34, 245, 12, 13; 381/101, 103

(56) References Cited

U.S. PATENT DOCUMENTS

| | | | | |
|---|---|---|---|---|
| 4,458,362 A | * | 7/1984 | Berkovitz et al. | 381/103 |
| 5,471,209 A | * | 11/1995 | Sutterlin et al. | 341/143 |
| 5,561,425 A | * | 10/1996 | Therssen | 341/143 |
| 5,727,023 A | * | 3/1998 | Dent | 375/244 |
| 5,982,315 A | * | 11/1999 | Bazarjani et al. | 341/143 |
| 6,018,262 A | * | 1/2000 | Noro et al. | 327/328 |

* cited by examiner

*Primary Examiner*—Peguy Jeanpierre
*Assistant Examiner*—Joseph J Lauture
(74) *Attorney, Agent, or Firm*—Ference & Associates

(57) ABSTRACT

A Sigma Delta A/D converter architecture which allows the multiplexed conversion of several high bandwidth analog signals.

14 Claims, 4 Drawing Sheets

US 6,518,903 B1

ANALOG-TO-DIGITAL CONVERTER

CROSS-REFERENCE TO RELATED APPLICATION

This application claims priority from pending U.S. Provisional Application Ser. No. 60/174,682, filed on Jan. 6, 2000, which is hereby incorporated by reference.

FIELD OF THE INVENTION

The present invention relates generally to analog-to-digital converters and, more particularly, to sigma-delta type analog-to-digital converters.

BACKGROUND OF THE INVENTION

A majority of modern digital communication systems use complex (I and Q) modulation schemes and a large amount of signal processing (equalizer, adaptive filtering, FSK demodulation, etc.). Most of this signal processing is only possible in the digital domain and applies to complex signals (a complex signal is represented by two signals, one corresponding to the real part, the other to the imaginary, also called in phase I, and in quadrature Q). This implies the Analog to Digital conversion of the two analog signals I and Q. Those two signals are typically the output of two mixers mixing down the RF carrier with a local oscillator in phase and in quadrature. The I and Q channels have, by construction, the same dynamic range and bandwidth.

SUMMARY OF THE INVENTION

The converter presented herein, in accordance with at least one presently preferred embodiment of the present invention, can be used in any system requiring simultaneous conversion of several analog channels of equal dynamic range and is therefore well adapted to the Analog to Digital conversion needs of a modern digital radio receiver.

In summary, at least one embodiment of the present invention provides apparatus for providing analog to digital conversion, the apparatus comprising: an input having at least two channels; an output having at least two channels; a multiplexer associated with the input; a single low-pass filter associated with all of the at least two channels of the output; and at least one component which implements a delay prior to a signal reaching the low-pass filter.

Further, at least one embodiment of the present invention provides a method of providing analog to digital conversion, the method comprising the steps of: inputting a signal having at least two channels; outputting a signal having at least two channels; providing a multiplexer associated with the input; providing a single low-pass filter associated with all of the at least two channels of the output; passing a signal through the single lowpass filter; and implementing a delay prior to the signal reaching the low-pass filter.

Additionally, at least one embodiment of the present invention provides a program storage device readable by machine, tangibly embodying a program of instructions executable by the machine to perform method steps for providing analog to digital conversion, the method comprising the steps of: inputting a signal having at least two channels; outputting a signal having at least two channels; providing a multiplexer associated with the input; providing a single low-pass filter associated with all of the at least two channels of the output; passing a signal through the single low-pass filter; and implementing a delay prior to the signal reaching the low-pass filter.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Figure 1:
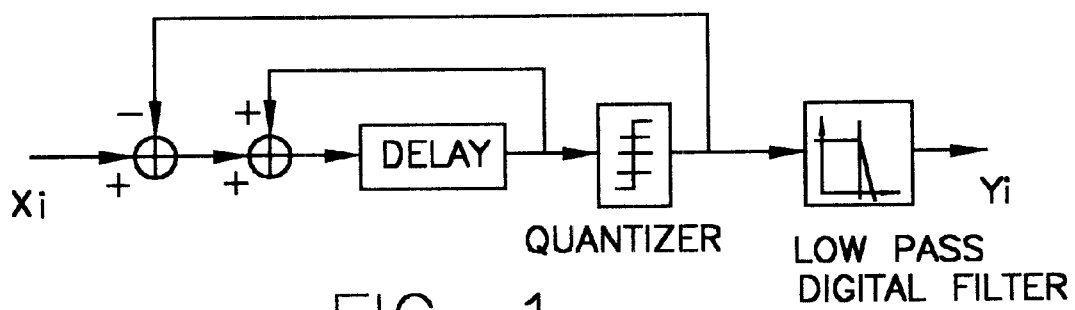
FIG. 1 illustrates a first-order delta-sigma converter.

As shown in FIG. 1, a first order delta-sigma A/D converter is composed of an integrator, a quantizer, a feed back loop and a digital filter. The input to the circuit is fed to the quantizer via an integrator, and the quantified output is fed back and subtracted from the input. This feedback forces the average value of the quantified signal to track the average input. Any difference between them accumulates in the Integrator and eventually corrects itself The output of the modulator is a roughly quantified (usually 1 to 4 bits) and highly over sampled bistream.

Its transfer function in this example is $$Y_i = X_{i-1} + Q_i - Q_{i-1} \text{ or } Y = z^{-1}X + (1-z^{-1})Q \quad (1)$$

where Q is the error introduced by the quantizer,

The spectrum of this output is the sum of the signal spectrum and the shaped quantization noise. For the given transfer function (1) the quantization noise is first order shaped. For a properly designed converter, this quantization noise will mainly lie at the high frequencies. Due to the high oversampling ratio of the Delta Sigma architecture, this spectrum spreads over a much larger bandwidth than the bandwidth of the signal.

If more noise rejection is needed, the order of the Delta Sigma can be increased by adding other integrators in the loop. For a second order Delta Sigma (2 integrators) the transfer function becomes $$Y = z^{-1}X + (1 - 2z^{-1} + z^{-2})Q \quad (2)$$

Figure 2:
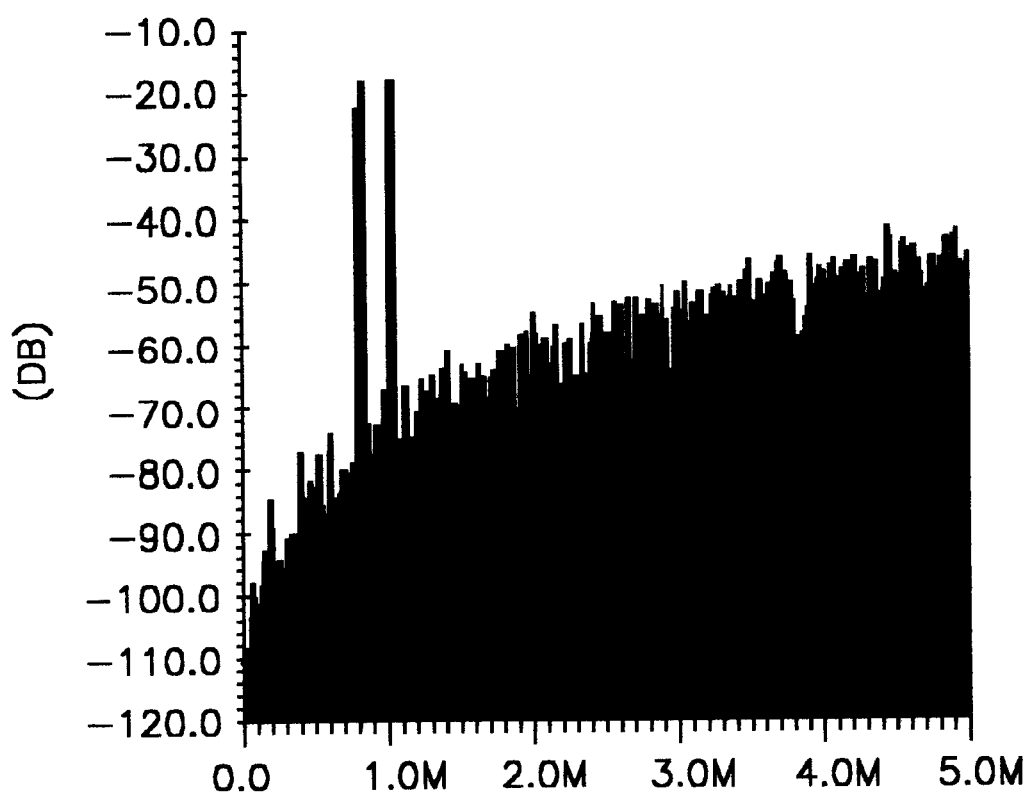
FIG. 2 illustrates an example of a second-order delta-sigma digital output spectrum.

For this example, the converted signal is the sum of two sine waves at 1 Mhz and 850 Khz. The noise is second order shaped. An example of a second-order Delta Sigma digital output spectrum is shown in FIG. 2.

Since the bandwidth of interest is much smaller than the output spectrum, this high-rate, low-precision bit stream output has to be digitally low-passed to recover the input signal. To maximize the SNR (Signal to Noise Ratio) of the Delta Sigma converter, this cutoff frequency should be as low as possible to remove the as much noise as possible (The noise being shaped by a Nth order function is raising rapidly). It is usually chosen equal to the cutoff frequency of the signal to be converted.

However, some problems have been noted in connection with converters of the type just described.

If the cutoff frequency is chosen equal to half the Bandwidth of the signal, then, when the system starts, the output of the filter becomes valid after typically 1/Fc sec where Fc is the cut off frequency of the low pass filter. After switching from one channel to the other, the low-pass filter has to be reset. Therefore, the first significant sample comes out of the filter at least 1/Fc sec after channel switching.

So, for an N-channel multiplexer, the maximum sampling rate of each channel is Fc/N. The bandwidth of each channel being 2*Fc, this sampling rate is too low to allow a complete signal acquisition.

Therefore, it is not possible to use an analog multiplexer at the input of a Sigma Delta converter in order to convert multiple channels.

Figure 3:
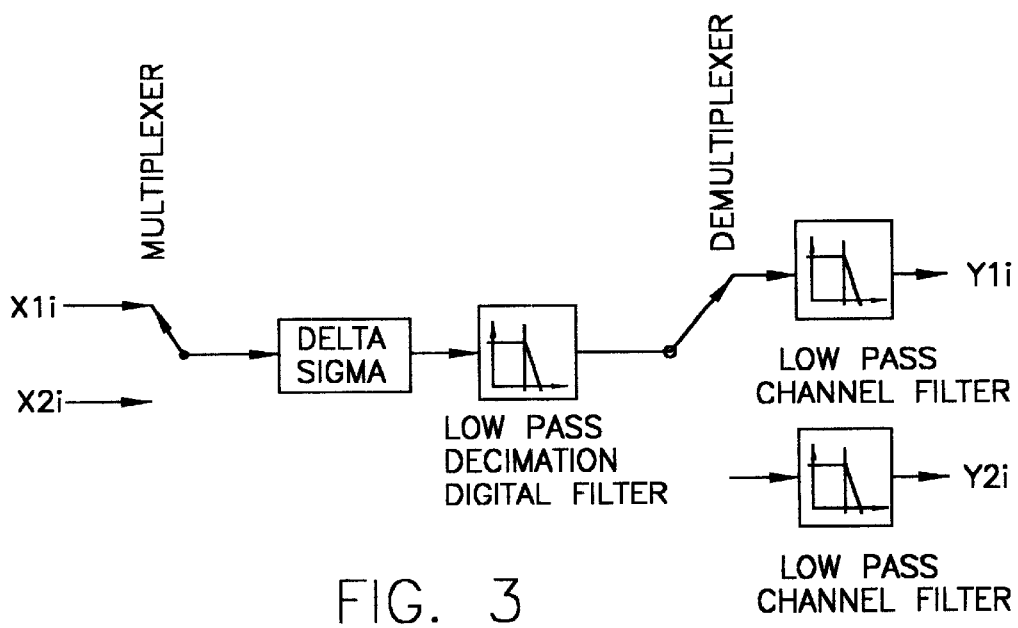
FIG. 3 illustrates a delta-sigma converter in which a digital low-pass filter is split into several stages.

As described in U.S. Pat. No. 5,345,236, one way to avoid this difficulty is to split the digital low-pass filter following the Delta Sigma into a first decimating stage, with a cutoff frequency equal to N*Fc, and N second stages following the demultiplexer with cutoff equal Fc. However, this solution is only valid for very high over sampling ratio converters. This solution is illustrated in FIG. 3.

Due to the effect of the demultiplexer following the decimation filter, the input of each individual channel filters is the output of the decimation filter sub sampled by a factor of N. However, during the sub sampling of a signal with bandwidth 2*B by a factor of N, the spectrum lying within [B/N, B] folds into [0, B/N].

For the application described in the aforementioned U.S. patent, owing to the very high OSR the decimation filter has enough high frequency rejection so that the quantization noise folding in the band of interest is negligible. However, modern Delta Sigma converters used in high bandwidth (>1 Mhz) communication systems tend to be low OSR converters, so as to reduce the clock speed. For this kind of application, the teachings of the aforementioned U.S. patent are not applicable.

Assume that there are N analog signals each with cutoff frequency off Fc/2 (bandwidth of Fc) which are to be converted. The converter's output after digital filtering must run at least at a Nyquist frequency of Fc for each channel. This implies that the converter switches channel with a frequency of at least N*Fc.

The Delta Sigma is running at a clock frequency of N*Fc*OSR where OSR is the Over Sampling Ratio (definition of OSR). The cutoff frequency off the first stage decimation filter would have to be N*Fc/2 in order to be able to switch channels with a frequency of N*Fc.

This means that, for each channel slot, this filter receives OSR bits and output one multibit number. The noise within [N*Fc/2, N*Fc*OSR/2] is folded on [0, N*Fc/2].

In order to achieve a given Signal to Noise Ratio off SNR dB, the energy of the noise lying within [N*Fc/2, N*Fc*OSR/2] has to be −SNR dB below the wanted signal.

The depth of the filter cannot be greater than OSR because it has to be reset every time the converter switches channel.

Finally, the filter has a limited depth of OSR, and has to attenuate the out of band noise by more than SNR dB.

For an interleaved Delta Sigma running at 30 MHz converting two channels of 1 Mhz Bandwidth, this leads to an Over Sampling Ratio of 15. The SNR required is usually more than 60 dB. For such a low OSR and high SNR those filter specifications are impossible to reach.

Figure 4:
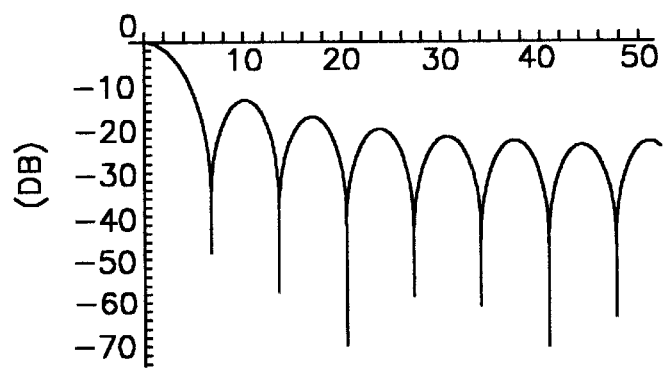
FIG. 4 illustrates an attenuation graph relating to a 15 taps average filter.

The attenuation of a 15 taps average filter is shown in FIG. 4. As shown, the second lobe is only 12 dB below the signal band whereas it should be below −60 dB.

Figure 5:
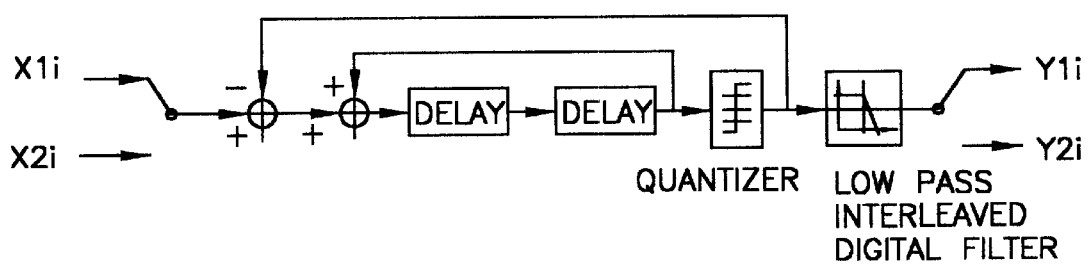
FIG. 5 illustrates a proposed converter in accordance with an embodiment of the present invention.

In accordance with at least one embodiment of the present invention, a proposed architecture adds a delay in the integrator loop, as shown in FIG. 5. As shown, a multiplexer is inserted at the input of the converter and feeds it with Channel 1 (X1i) during even clock cycles, and with channel 2 (X2i) during odd clock cycles. The circuit considered at even (or odd) clock cycles is exactly similar to a first order non interleaved Sigma Delta modulating Channel 1 (or Channel 2), i.e., $Y2_{2i}=X2_{2i}+Q_{2i}-Q_{2i-2}$ and $Y2_{2i+1}=X2_{2i+1}+Q_{2i+1}-Q_{2i-1}$, respectively.

The digital filter described below can be similarly modified by inserting an extra delay wherever a delay is already present. The final output of the interleaved converter will be an interleaved number stream where an odd (or even) clock cycle represents Channel 1 (or, respectively, Channel 2).

Therefore, in order to digitize N channels at a sampling rate of S, the interleaved Delta Sigma converter has to run with a clock frequency of N*S.

This interleaving scheme can be extended to any kind of Delta Sigma architecture of arbitrary order, and to any number of channels.

Figure 6:
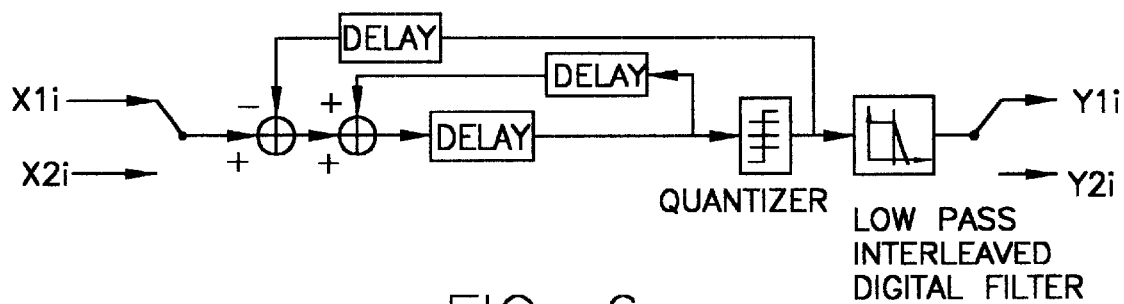
FIG. 6 illustrates a refined converter in accordance with an embodiment of the present invention.

An actual implementation, as shown in FIG. 6, uses a slightly different scheme, for reasons related to implementation. The transfer function is equivalent to the one previously described. The output of the integrator loop is taken at the output of the first delay instead of the second one. To compensate, an extra delay is inserted in the feedback loop.

Figure 7:
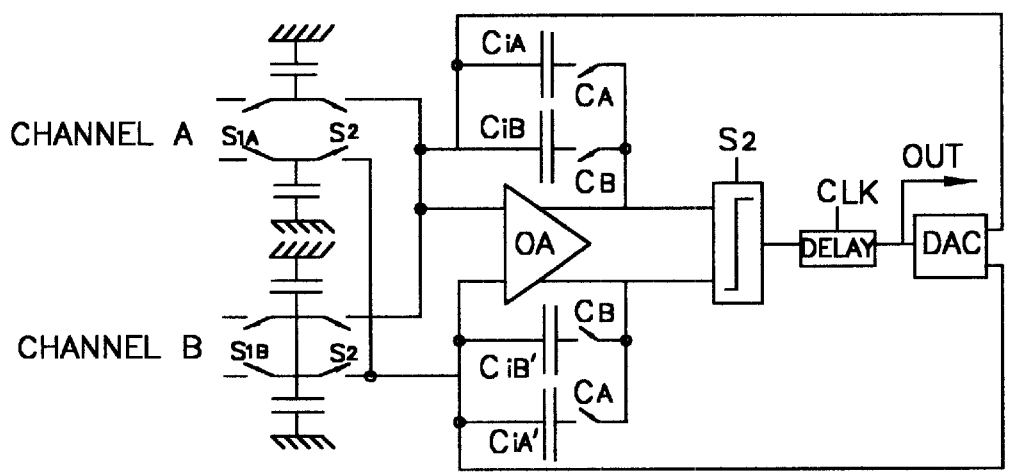
FIG. 7 illustrates a set of capacitors in connection with the converter illustrated in FIG. 6.

In this implementation, and as shown in FIG. 7, the multiplexing at the input is accomplished by having two sets of sampling capacitors CSA and CSB corresponding to the channels. The "Delay" box stands for a standard Flip Flop. The "DAC" can be any kind of digital to analog converter. In the implemented circuit, a switched capacitor design is employed, but a continuous time current source would also work.

Figure 8:
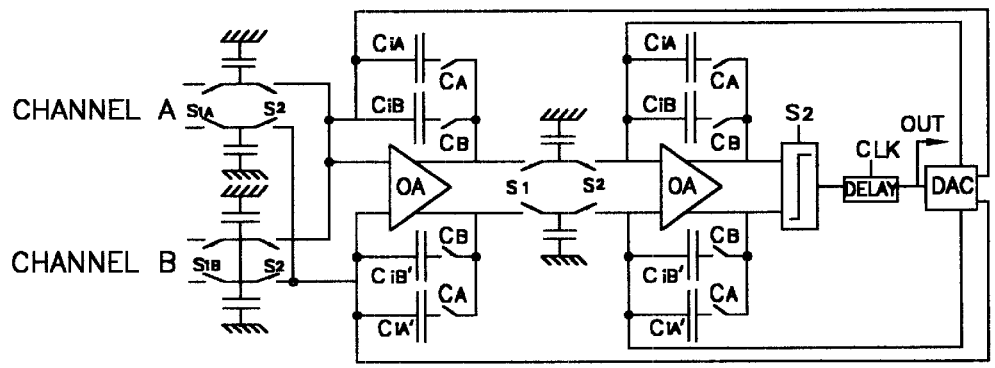
FIG. 8 illustrates a set of capacitors in accordance with another embodiment of the present invention, in connection with the converter illustrated in FIG. 6.

For a Nth order Delta Sigma, only the first integrator of the first stage needs the double set of sampling capacitors, while the subsequent integrators have one set of sampling capacitors and two sets of integrating capacitors. FIG. 8 is an example of a second-order 2-channel interleaved Delta Sigma.

Figure 9:
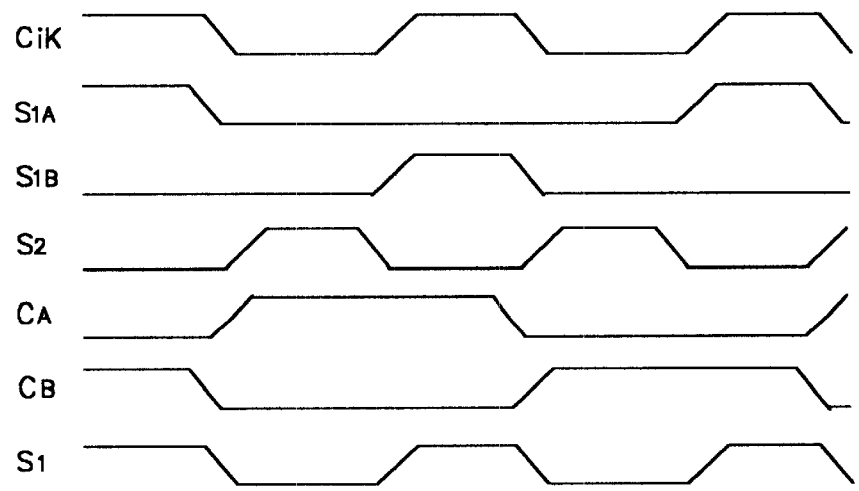
FIG. 9 illustrates the timing of different phases as applied to the embodiment of FIG. 6.

The timing of the different phases applied to the switches, illustrated in FIG. 9, is as follows.

$S_{1A}$ is the sampling phase of Channel A and $S_{1B}$ is the sampling phase of Channel B.

S2 is the integration phase during which the Operational Amplifier (OA) transfers the charges from either the $C_{SA}$ or $C_{SB}$ set of sampling capacitors and the DAC feed back to the $C_{iA}$ or $C_{iB}$ set of integrating capacitors.

$C_A$ (or $C_B$) selects the set of integrator capacitors to be used. It is high following the sampling of Channel A (or B). It stays high during the sampling of Channel B ($S_{1B}$) (or $S_{1A}$ of Channel A) to allow enough time for the comparator to reach its final state.

The comparator is reset with signal $S_2$ and its output is latched by "Delay" on the falling edge of the clock (clk). When $C_A$ (resp $C_B$) is high the comparator output (−1 or 1) forms the channel A (resp B) output bit stream that has to be digitally low-passed.

The DAC is only active during the integration phase S2.

$S_1$ is equivalent to ($S_{1A}$ or $S_{1B}$), signal $S_1$ is needed only if the order of the Delta Sigma is greater than 1.

Several advantages are inherent in the implementation just discussed. For one, the conversion matching between the two channels is limited only by the capacitors matching of the pairs ($C_{SA}$, $C_{iA}$) and ($C_{SB}$, $C_{iB}$).

Further, the transfer function of a Delta Sigma modulator can also be modified by finite gain of the OTA, charge injection from the switches, charge leakage from the integrator, DC offset from the comparator threshold imprecision and non-linearities from the DAC (multilevel feedback). But for all those second-order influences, the effect will be perfectly equivalent on the two channels, i.e., signal distortion will be the same. Whereas, for example, it is nearly impossible to obtain a good gain matching between two OTA of two different Delta Sigma's.

Additionally, the die area is reduced by a factor of two compared to an implementation involving two Delta Sigma modulators.

Furthermore, if the Sigma Delta is also providing some amount of variable gain then those interesting matching proprieties are extended to the whole (VGA+Delta Sigma) system. The two channels are amplified with a tunable gain perfectly equivalent on both channels.

It is to be understood that the present invention, in accordance with at least one presently preferred embodiment, includes an input having at least two channels, an output having at least two channels, a multiplexer associated with the input, a single low-pass filter associated with all of the at least two channels of the output, and at least one component which implements a delay prior to a signal reaching the low-pass filter. Together, the input, output, multiplexer, low-pass filter and at least one component which implements a delay may be implemented on at least one general-purpose computer running suitable software programs. These may also be implemented on at least one Integrated Circuit or part of at least one Integrated Circuit. Thus, it is to be understood that the invention may be implemented in hardware, software, or a combination of both.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. Apparatus for providing substantially simultaneous, multi-channel analog to digital conversion, said apparatus comprising:

an input having at least two channels;

an output having at least two channels;

a multiplexer associated with said input;

a single low-pass filter associated with all of said at least two channels of said output;

at least one component which implements a delay prior to a signal reaching said low-pass filter; and said multiplexer and said at least one component which implements a delay being adapted to provide the substantially simultaneous analog to digital conversion of all of said at least two channels of said input and to preclude the mixing of multiplexed signals during analog to digital conversion.

2. The apparatus according to claim 1, wherein said multiplexer is adapted to deliver input from one of said channels during even clock cycles and input from another of said channels during odd clock cycles.

3. The apparatus according to claim 1, wherein said multiplexer comprises a first set of at least one sampling capacitor corresponding to a first of said channels at said input and a second set of at least one sampling capacitor corresponding to a second of said channels at said input.

4. The apparatus according to claim 3, wherein said first set of at least one sampling capacitor comprises two sampling capacitors and said second set of at least one sampling capacitor comprises two sampling capacitors.

5. The apparatus according to claim 3, further comprising:

an integrator loop;

said integrator loop comprising said at least one component which implements a delay; and said at least one component which implements a delay comprising at least one integrating capacitor in communication with said sampling capacitors.

6. The apparatus according to claim 5, wherein said at least one component which implements a delay further comprises a flip-flop.

7. The apparatus according to claim 5, wherein:

said integrator loop includes a plurality of stages;

a first of said stages includes a first set of at least one integrating capacitor in communication with said first and second sets of at least one sampling capacitor:

a second of said stages includes a single set of at least one sampling capacitor and two sets of at least one integrating capacitor.

8. A method of providing analog to digital conversion, said method comprising the steps of:

inputting a signal having at least two channels;

outputting a signal having at least two channels;

providing a multiplexer associated with said input;

providing a single low-pass filter associated with all of said at least two channels of said output;

passing a signal through said low-pass filter; and implementing a delay prior to said signal reaching said low-pass filter;

whereby said steps of providing a multiplexer and implementing a delay result in the substantially simultaneous analog to digital conversion of all of said at least two channels of said input and in precluding the mixing of multiplexed signals during analog to digital conversion.

9. The method according to claim 8, further comprising the step of, with said multiplexer, delivering input from one of said channels during even clock cycles and delivering input from another of said channels during odd clock cycles.

10. The method according to claim 8, wherein said step of providing said multiplexer comprises providing a first set of at least one sampling capacitor corresponding to a first of said channels at said input and a second set of at least one sampling capacitor corresponding to a second of said channels at said input.

11. The method according to claim 10, wherein said step of providing said first set of at least one sampling capacitor comprises providing two sampling capacitors and said step of providing said second set of at least one sampling capacitor comprises providing two sampling capacitors.

12. The method according to claim 10, further comprising the steps of:

providing an integrator loop;

said step of providing an integrator loop comprising providing at least one integrating capacitor in communication with said sampling capacitors; and said step of implementing a delay comprising employing said at least one integrating capacitor.

13. The method according to claim 12, wherein said step of providing an integrator loop comprises providing a plurality of stages, wherein a first of said stage includes a first set of at least one integrating capacitor in communication with said first and second sets of at least one sampling capacitor and a second of said stages includes a single set of at least one sampling capacitor and two sets of at least one integrating capacitor.

14. A program storage device readable by machine, tangibly embodying a program of instructions executable by the machine to perform method steps for providing analog to digital conversion, said method comprising the steps of:

inputting a signal having at least two channels;

outputting a signal having at least two channels;

providing a multiplexer associated with said input;

providing a single low-pass filter associated with all of said at least two channels of said output;

passing a signal through said low-pass filter; and implementing a delay prior to said signal reaching said low-pass filter;

whereby said steps of providing a multiplexer and implementing a delay result in the substantially simultaneous analog to digital conversion of all of said at least two channels of said input and in precluding the mixing of multiplexed signals during analog to digital conversion.

* * * * *